United States Patent [19]

Watanabe et al.

[11] Patent Number: 4,739,125
[45] Date of Patent: Apr. 19, 1988

[54] ELECTRIC COMPONENT PART HAVING LEAD TERMINALS

[75] Inventors: Yutaka Watanabe, Hadano; Fumiyuki Kobayashi, Sagamihara; Masao Sekibata, Kunitachi; Shigeo Kuroda, Ome; Akio Yasukawa, Ibaraki; Shigejiro Sekine, Hadano, all of Japan

[73] Assignee: Hitachi, Ltd., Tokyo, Japan

[21] Appl. No.: 907,006

[22] Filed: Sep. 15, 1986

[30] Foreign Application Priority Data

Sep. 27, 1985 [JP] Japan .................. 60-212325

[51] Int. Cl.⁴ ........................................ H01L 23/50
[52] U.S. Cl. .................. 174/52 FP; 361/405; 361/408
[58] Field of Search ............ 174/52 FP; 357/74; 361/405, 408; 339/17 CF

[56] References Cited

U.S. PATENT DOCUMENTS 4,647,126 3/1987 Sobota ................ 361/405 X

FOREIGN PATENT DOCUMENTS 55-113353 9/1980 Japan .
57-181144 11/1982 Japan ................ 339/17 CF Primary Examiner—Arthur T. Grimley
Assistant Examiner—David A. Tone
Attorney, Agent, or Firm—Antonelli, Terry & Wands

[57] ABSTRACT

An electric component part has its lead terminals bent in thickness directions in a middle section thereof at least two positions so that a step section virtually in parallel to the bottom of a circuit substrate is formed with the intention of absorbing the external force applied to the part by chaging the shape of the lead terminals. Increase in the part layout area due to the formation of the horizontal step section can be avoided, when necessary, by shifting the terminal lead out position on the component part inward thereby to minimize the jetty dimensions.

5 Claims, 6 Drawing Sheets

FIG. IA
PRIOR ART
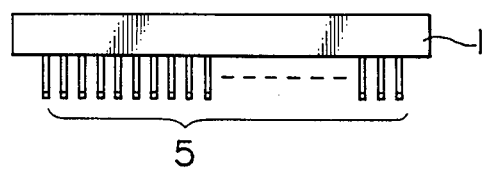
FIG. IB
PRIOR ART
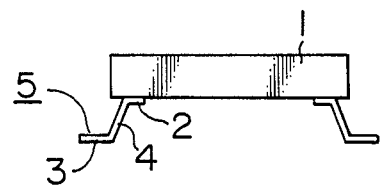
FIG. 2
PRIOR ART
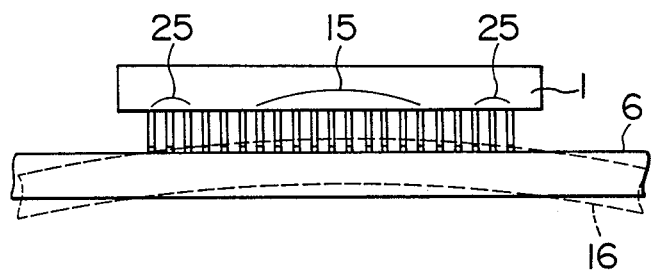

ELECTRIC COMPONENT PART HAVING LEAD TERMINALS

BACKGROUND OF THE INVENTION

This invention relates to an electric component part to be mounted and connected through its lead terminals on the surface of a printed wiring board, and particularly to an electric component part with its lead terminals having a proper shape for the enhanced reliability of connection.

A recent trend of high-density packaging of electric component parts such as integrated circuit (IC) chips, LSI chips, multi-chip hydrid modules and resistor arrays on a printed wiring board is to form such component parts in "flat type" so that their lead terminals can be in flat contact with the surface of a printed wiring board and to solder the lead terminals to the lands on the printed wiring board.

These surface-mounted devices have a typical lead shape as described in, for example, Japanese patent unexamined publication No. 55-113353, and it is shown in FIG. 1. In the figure, reference number 1 denotes a substrate having a circuit function by mounting chip carriers (not shown) accommodating circuit elements, and each of lead terminals 5 consists of a section 2 to be connected to the substrate 1, a section 3 to be connected to a printed wiring board (not shown) and a virtually straight section 4 between the connecting sections. However, when a large number of component parts having the above-mentioned lead terminals are soldered on a printed wiring board to complete a large functional package, a serious problem will arise in the reliability of solder connections between the lead terminals and the printed wiring board. The reason is that a large functional package is usually plugged in through connectors to the slots of the back board, and the plugging force in the assembling operation causes the printed wiring board to warp, which produces a significant external force applied to the solder connections. In testing, a large functional package, it is often subjected to an "in-circuit test" in which only a small part of the printed wiring board is probed, and such a test process also causes a warp of the printed wiring board. In case a printed wiring board has warped, as shown in FIG. 2, from the original shape 6 shown by the solid line to the shape 16 shown by the dashed line, lead terminals 15 located in the central part of the lead alignment are subjected to a compressive stress, while lead terminals 25 located at both end sections are subjected to a tensile stress. Among these stresses the conventional lead shape has been particularly incapable of absorbing the tensile stress, resulting frequently in a breakdown of solder connections and thus in defective connections between the printed wiring board and lead terminals located in the end sections of the lead alignment.

SUMMARY OF THE INVENTION

An object of this invention is to provide an electric component part having a structure of connection on a printed wiring board, capable of retaining the reliability of connection even if the board should warp and also suitable for high-density packaging.

In the conventional electric component parts having their lead terminals formed straight between the connecting sections, if the printed wiring board which mounts parts by soldering has become deformed, the lead terminals cannot absorb the deformation, resulting in a breakdown of solder connections. The present invention is intended to solve the problem, and the inventive electric component part features to have lead terminals each of which is bent at at least two positions in thickness directions between the connecting end sections so that a step section is formed virtually in parallel to the bottom of the circuit substrate, thereby absorbing the deformation of the printed wiring board by means of the step section.

The formation of the step section will increase the planar dimension of the lead terminals, but, if it is required to have a smaller part layout area on the printed wiring board, the terminal lead out position may be shifted inwardly at the bottom of the part thereby to minimize the jetty of lead terminals.

BRIEF DESCRIPTION OF THE DRAWINGS

FIGS. 1A and 1B are side views of the conventional electric component part;

FIG. 2 is a side view showing the conventional electric component part mounted on a printed wiring board;

DESCRIPTION OF THE PREFERRED EMBODIMENT

Figure 3:
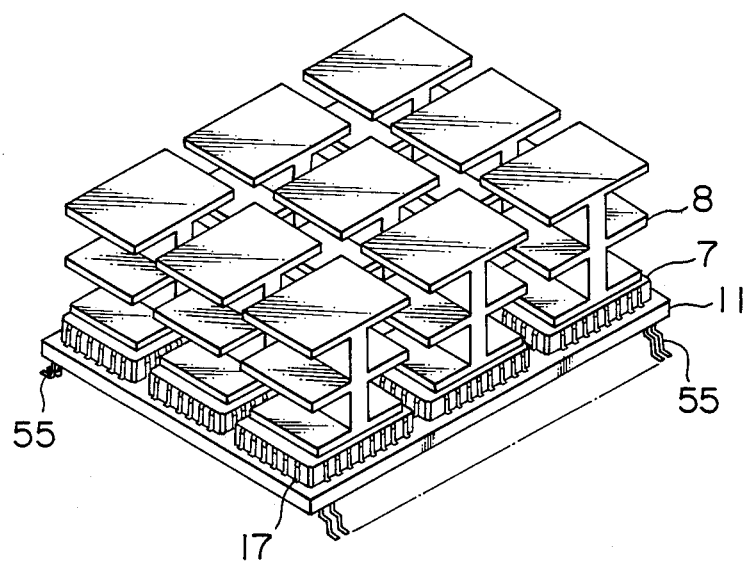
FIG. 3 is a perspective view of the electric component part embodying the present invention.

An embodiment of this invention will now be described with reference to the drawings. FIG. 3 shows the inventive electric component part having bent lead terminals 55. In this embodiment, the lead terminals 55 are planted on a ceramic multi-layer wiring board 11 which is made from a green sheet of alumina ceramic through the processes of forming through-holes in the sheet, printing tungsten paste on the inner surface of the through-holes and the sheet surface, laminating several sheets, sintering the lamination and plating the board. The ceramic board 11 has pads extending in two colums along opposite side edges on its bottom surface for planting the lead terminals 55, other pads on its upper surface for connection with chip carriers, and signal and power lines inside the board. On the upper side of the ceramic multi-layer wiring board 11, chip carriers 7 accommodating circuit elements are connected using solder 17, and each chip carrier is provided thereon with an individual heat sink 8. The ceramic multi-layer wiring board and the mounted component parts constitute a package. Connected on the rear side of the ceramic multi-layer wiring board 11 using silver solder are 96 pieces of lead terminals 55 of 42-alloy with a 0.25 mm width in two lines each made up of 48 pins at an interval of 0.762 mm.

Figure 4:
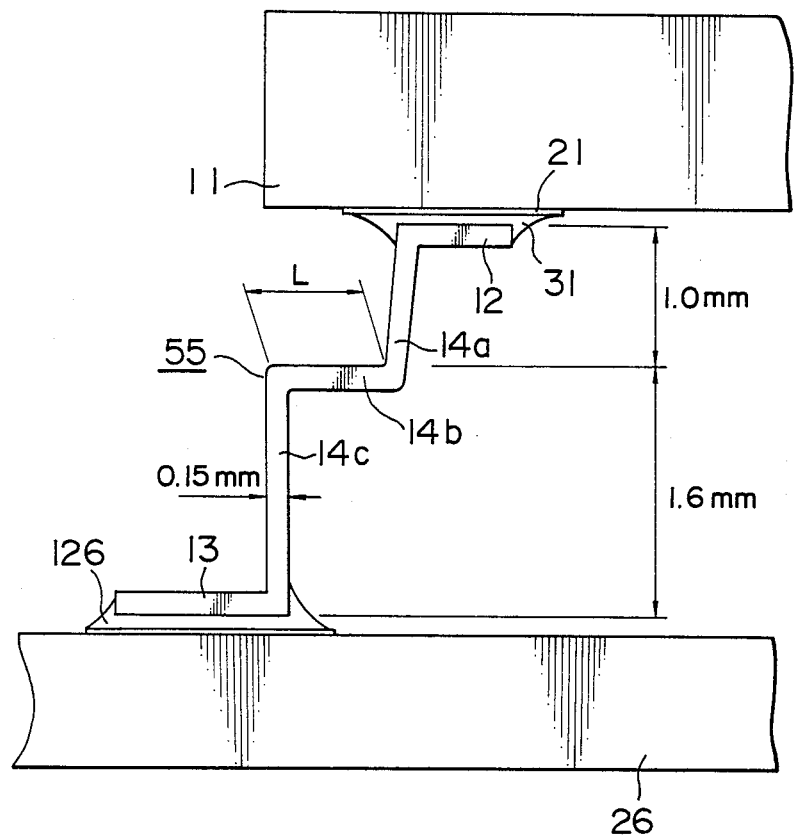
FIGS. 4, 5(A) and 5(B) are side views of a lead terminal of the electric component part embodying the present invention.

FIG. 4 shows the details of the lead terminal when the electric component part is mounted on the printed wiring board. The lead terminal 55 is connected using silver solder 31 to a lead connection pad 21 provided on the rear side of the ceramic multi-layer wiring board 11. The lead terminal consists of a section 12 to be connected to the ceramic multi-layer wiring board 11, a section 13 to be connected to the printed wiring board 26 and an intermediate section 14 (14a, 14b, 14c) between these connecting sections. The intermediate section 14 is bent at two positions in thickness directions so that it has virtually vertical sections 14a and 14c interposed by a virtually horizontal step section 14b with respect to the ceramic multi-layer wiring board 11. In this embodiment, the horizontal step section 14b is located beneath the ceramic multi-layer wiring board 11 so that the electric component part does not have an increased layout area. The connecting section 13 is connected to the printed wiring board 26 using solder 12b.

Figure 5A:
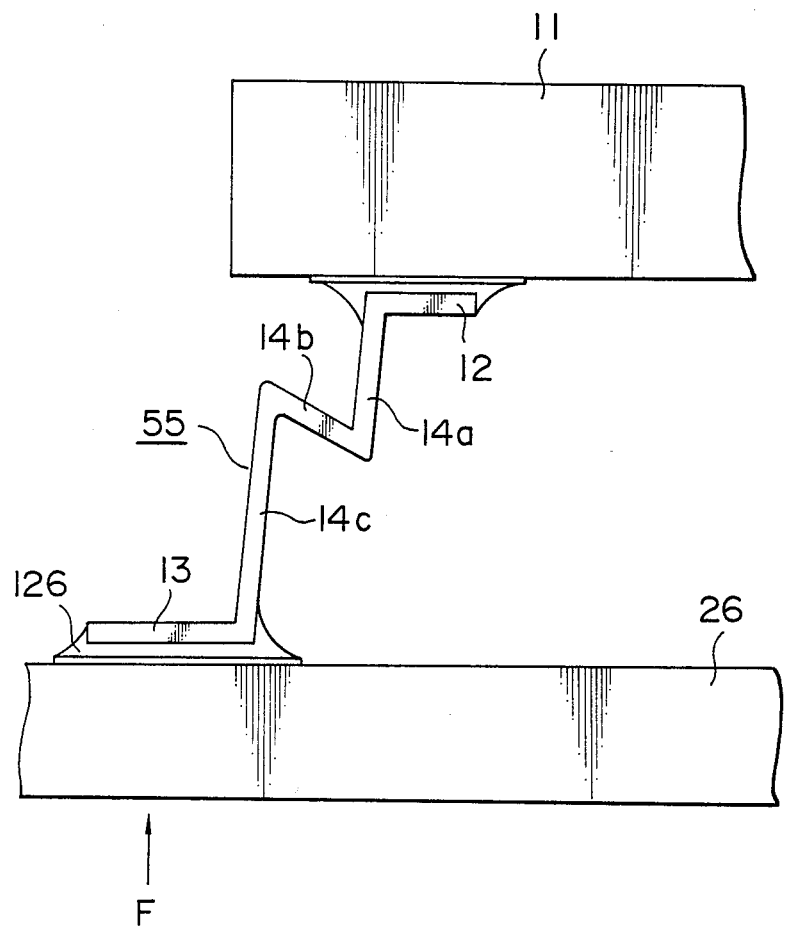
Figure 5B:
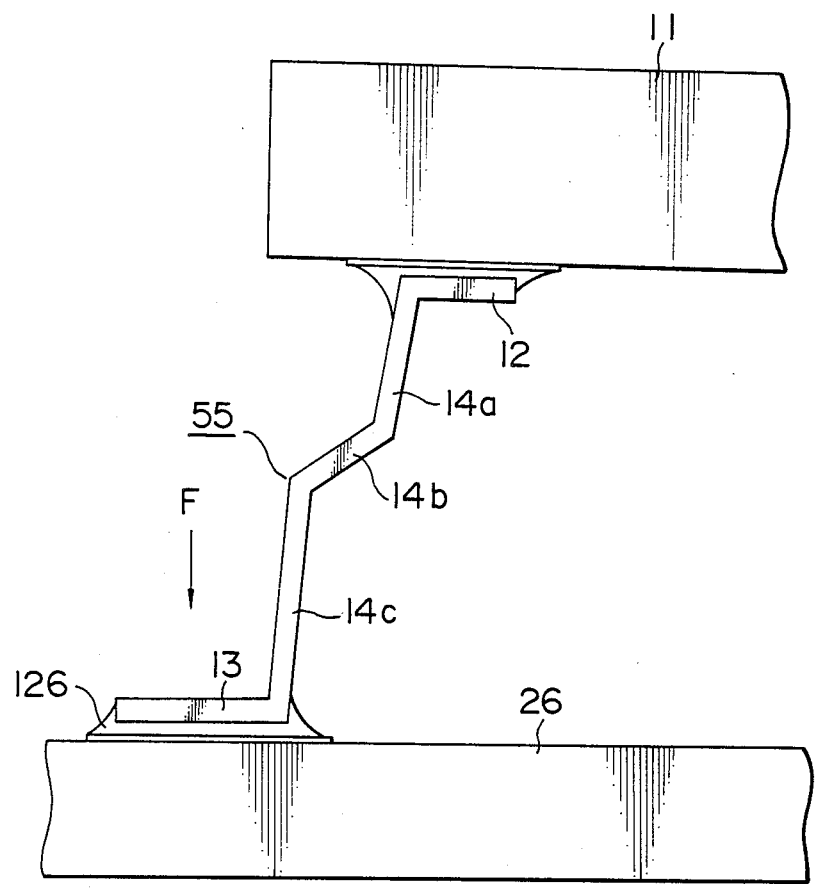

The inventive electric component part has its lead terminals changing the shape if the printed wiring board 26 should warp, and the reliability of connection at the connecting section 13 using solder 12b is ensured. Namely, as shown in FIG. 2, if the printed wiring board has warped from the original shape 6 shown by the solid line to the shape 16 shown by the dashed line, lead terminals 15 of the inventive electric component part located in the central part of the alignment will change the shape as shown in FIG. 5(A), while lead terminals 25 located in the end sections of the alignment will change the shape as shown in FIG. 5(B). On this account, the solder 12b connecting the section 13 to the printed wiring board 26 is not placed under the stress which causes breakdown.

Figure 6:
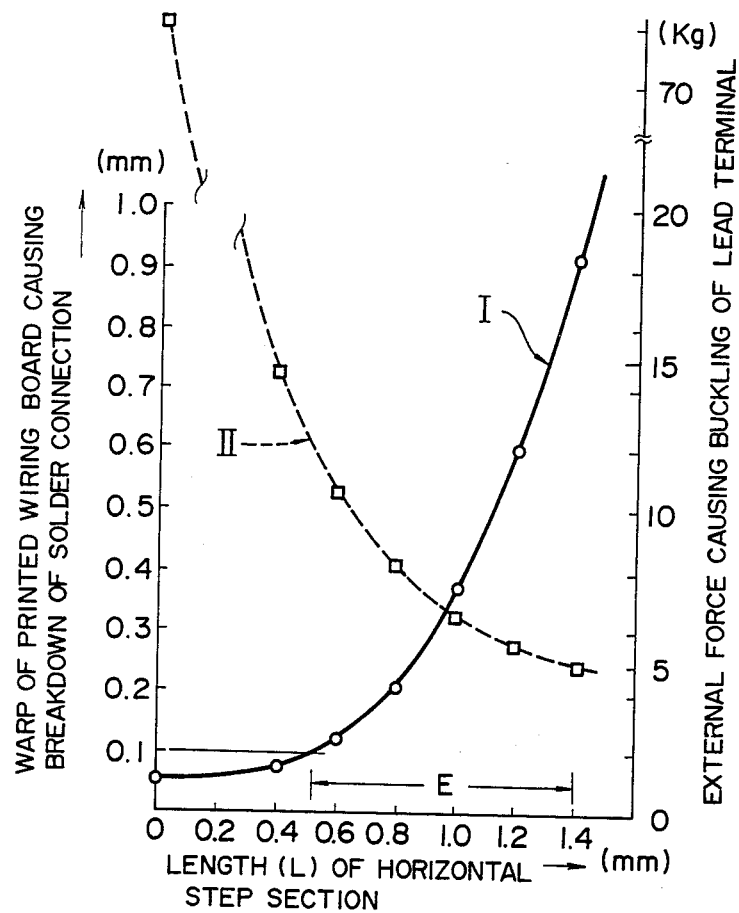
FIG. 6 is a graph showing the warp resistivity and pressure resistivity of terminal connection according to this invention against the deformation of the printed wiring board.

FIG. 6 is a graph showing by (I) the result of measurement of the relation between the length L of the horizontal step section 14b of a lead terminal and the amount of warp of the printed wiring board at which the connecting solder 12b breaks down. The measurement result implies that the conventional lead terminal without the horizontal step section 14b, i.e., L=0, will have its connecting solder broken merely by the occurrence of a 0.05 mm warp across a total distance of 35.814 mm (0.762 mm×47 lead pitches), while the provision of a 0.5 mm horizontal step section, i.e., L=0.5 mm, makes the solder to withstand a warp of up to 0.1 mm, and a 0.8 mm horizontal step section, i.e. L=0.8 mm withstands a warp of up to 0.2 mm. During package insertion or testing, a printed wiring board is usually warped as much as 0.1 mm across a 35 mm distance, and therefore the lead terminal of this embodiment having a thickness of 0.15 mm needs to have a horizontal step section of at least L=0.5 mm. The thickness of the lead terminal is in a proportional relation with the length L of the horizontal step section for providing a certain warp resistivity, and therefore in practice the horizontal step section 14b needs to have a length L three times or more of the thickness.

On the other hand, an excessive length L of the horizontal step section 14b can invite a buckling of lead terminals when an external force is applied to the electric component part beyond their limit of elasticity. FIG. 6 shows by (II) the result of measurement of the relation between the length L of the horizontal step section 14b of the lead terminal and the external force which causes a buckling of a lead terminal. It is unavoidable for a package mounting such electric components to have the application of external force of around 5 kg per each component part during the manufacturing and following processes, and therefore the horizontal length L must not exceed around 1.4 mm as will be appreciated from the characteristics (II). This length is about nine times as much as the thickness (0.15 mm) of the lead terminal.

Although the foregoing embodiment is the application of this invention to the lead terminals planted on the rear side of a ceramic multi-layer wiring board which mounts chip carriers on the upper side, the inventive electric component part can also be a structure in which LSI chips are die-bonded on a ceramic substrate. Alternatively, the inventive electric component part can be a circuit structure having no chip carriers or the like on the upper surface of the body.

Although in the above embodiment the lead terminal is bent in a step shape, it may be bent between the connecting section 12 and intermediate section 14a oppositely to the case of FIG. 4 so that the lead terminal is connected to the substrate 11 with the end of the section 12 being directed outwardly, as a modification of the embodiment.

According to this invention, as described above, solder connections between lead terminals and a printed wiring board are prevented from breakdown when the board warps, whereby electric component parts with high connecting reliability can be accomplished. The inventive lead terminal structure can have the elastic horizontal step section accommodated beneath the circuit substrate, whereby the electric component part can have a minimized layout area suitable for high density packaging.

We claim:
1. An electric component part to be mounted on a printed wiring board, comprising:
a virtually flat ceramic multi-layer wiring board including signal and power lines therein and having a first rectangular shaped principal surface with chip carriers mounted thereon and a second rectangular shaped principal surface having a plurality of pads arranged along opposite sides thereof so that said pads are disposed in two columns; and
a plurality of lead terminals, each of said lead terminals being bent and including a first portion connected to one of said pads with solder for flat contact with said one pad, said first portion extending in a first direction at a right angle to a direction of the column of said one pad so that one end of said first portion is disposed close to one side of said second principal surface of said ceramic multi-layer wiring board and the other end of said first portion is spaced apart from said one side of said ceramic multi-layer wiring board, a step section extending virtually in parallel to said first portion of said lead terminal and having one end located beneath said one end of said first portion and an other end of said step section being located opposite to said one end of said step section so that said step section extends from said one end thereof in a second direction opposite to said first direction, and a second portion disposed for flat contact with a terminal section on said printed wiring board, said second portion having one end located beneath said other end of said step section of said lead terminals and an other end of said second portion being located opposite to said one end of said second portion so that said second portion extends from said one end thereof in said second direction, a principal part of said second portion of said lead terminal being located outside of a space beneath said ceramic multi-layer wiring board;
each of said lead terminals being bent in a thickness direction thereat at said one end of said first portion, bent in a transverse direction to said thickness direction at said one end of said step section, bent in said thickness direction at said other end of said step section and bent in said transverse direction to said thickness direction at said one end of said second portion, each of the angles at the bent positions being at least a right angle;

said first and second portions of said lead terminal and said step section thereof being arranged in non-overlapping relationship.

2. An electric component part according to claim 1, wherein said step section of each lead terminal has a length extending in said second direction of three to nine times the thickness of said lead terminal.

3. An electric component part according to claim 1, wherein the principal part of said step section of each lead terminal is located in a space beneath said ceramic multi-layer wiring board.

4. An electric component part to be mounted on a printing wiring board, comprising:
- a virtually flat circuit substrate having a plurality of pads on a principal surface thereof;
- a plurality of bent leads, each lead including a first portion connected to one of said pads with solder for flat contact with said one pad, said first portion having one end close to a side of said principal surface and an other end spaced apart from said one side so that said first portion extends from said one end in a first direction, a step section extending virtually in parallel to said first portion of said lead terminal and having one end located beneath said one end of said first portion and an other end of said step section being located opposite to said one end of said step section so that said step section extends from said one end thereof in a second direction opposite to said first direction, a second portion for flat contact with a terminal section on said printed wiring board and having one end located beneath said other end of said step section of said lead terminal and an other end of said second portion being located opposite to said one end of said second portion so that said second portion extends from said one end thereof in said second direction, a principal part of said second portion being located outside a space beneath said circuit substrate;
- each of said lead terminals being bent in a thickness direction thereof at said one end of said first portion, bent in a transverse direction to said thickness direction at said one end of said step section, bent in said thickness direction at said other end of said step section, and bent in said transverse direction to said thickness direction at said one end of said second portion, each of the angles at the bent positions being at least a right angle;
- said first and second portions and said step section of each lead terminal being arranged in non-overlapping relationship.

5. An electric component part according to claim 4, wherein said step section of each lead terminal has a length extending in said second direction of three to nine times the thickness of said lead terminal.

* * * * *